United States Patent
Hirase et al.

(10) Patent No.: US 10,608,203 B2
(45) Date of Patent: Mar. 31, 2020

(54) SILICON OXIDE SEALING LAYER FOR ELECTROLUMINESCENT DEVICE

(71) Applicant: Sharp Kabushiki Kaisha, Sakai, Osaka (JP)

(72) Inventors: Takeshi Hirase, Sakai (JP); Tetsuya Okamoto, Sakai (JP); Tohru Senoo, Sakai (JP); Tohru Sonoda, Sakai (JP); Takashi Ochi, Sakai (JP); Mamoru Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/746,005

(22) PCT Filed: Jul. 15, 2016

(86) PCT No.: PCT/JP2016/070948
§ 371 (c)(1),
(2) Date: Jan. 19, 2018

(87) PCT Pub. No.: WO2017/014171
PCT Pub. Date: Jan. 26, 2017

(65) Prior Publication Data
US 2018/0212193 A1 Jul. 26, 2018

(30) Foreign Application Priority Data

Jul. 23, 2015 (JP) .................................. 2015-146107

(51) Int. Cl.
*H01L 51/52* (2006.01)
*H01L 51/00* (2006.01)
(Continued)

(52) U.S. Cl.
CPC ...... *H01L 51/5256* (2013.01); *H01L 51/0097* (2013.01); *H05B 33/04* (2013.01);
(Continued)

(58) Field of Classification Search
CPC ........... H01L 51/5256; H01L 2251/303; H01L 27/3244; H01L 27/322; H01L 51/0097; H05B 33/04
See application file for complete search history.

(56) References Cited

U.S. PATENT DOCUMENTS

2005/0116637 A1* 6/2005 Yoshizawa .......... H01L 51/0097
313/512
2007/0105255 A1* 5/2007 Nishimura .......... H01L 27/3276
438/34
(Continued)

FOREIGN PATENT DOCUMENTS

JP 2005-335067 A 12/2005
JP 2007-200890 A 8/2007
(Continued)

OTHER PUBLICATIONS

Official Communication issued in International Patent Application No. PCT/JP2016/070948, dated Oct. 18, 2016.

*Primary Examiner* — Robert T Huber
*Assistant Examiner* — Gardner W. S. Swan
(74) *Attorney, Agent, or Firm* — Keating & Bennett, LLP (57) ABSTRACT

An organic EL display device includes a substrate and an organic EL element (electroluminescent element) provided on the substrate. The organic El display device includes a sealing layer that seals the organic EL element. The sealing layer includes silicon oxide films. Moreover, the degree of oxidation of the silicon oxide films is set to 1.2 or more and 1.8 or less.

13 Claims, 8 Drawing Sheets

(51) Int. Cl.
*H05B 33/04* (2006.01)
*H01L 27/32* (2006.01)

(52) U.S. Cl.
CPC ........ *H01L 27/322* (2013.01); *H01L 27/3244* (2013.01); *H01L 2251/303* (2013.01)

(56) References Cited

U.S. PATENT DOCUMENTS

| | | |
|---|---|---|
| 2007/0170455 A1 | 7/2007 | Choi et al. |
| 2011/0052893 A1 | 3/2011 | Oouchi |
| 2014/0319493 A1* | 10/2014 | Lee .................. H01L 29/78603 257/40 |
| 2015/0155505 A1* | 6/2015 | Yamazaki ........... H01L 27/3272 257/40 |
| 2015/0214504 A1 | 7/2015 | Sonoda et al. |
| 2015/0287769 A1* | 10/2015 | Hsu .................... H01L 27/1218 257/40 |
| 2017/0141354 A1* | 5/2017 | Bonnet ............... H01L 51/5237 |

FOREIGN PATENT DOCUMENTS

| | | |
|---|---|---|
| JP | 2011-51195 A | 3/2011 |
| JP | 2011-195850 A | 10/2011 |
| JP | 2012-69507 A | 4/2012 |
| JP | 2013-16371 A | 1/2013 |
| WO | 2014/038158 A1 | 3/2014 |

\* cited by examiner

SILICON OXIDE SEALING LAYER FOR ELECTROLUMINESCENT DEVICE

TECHNICAL FIELD

The present invention relates an electroluminescent device including an EL (electroluminescent) element.

BACKGROUND ART

In recent years, flat panel displays have been widely used in various commodities and fields, and the flat panel displays are required to have a larger size, a higher image quality, and a lower power consumption.

Under these circumstances, an organic EL display device is attracting considerable attention as an all-solid-state flat panel display with excellent low-voltage driving capability, high-speed responsibility, and self-luminous property. The organic EL display device includes an organic EL element that utilizes the electroluminescence of an organic material.

In an active matrix type organic EL display device, e.g., a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above conventional organic EL display device, it has been proposed that the organic EL element is sealed to protect it from degradation due to moisture or oxygen.

Specifically, the conventional organic EL display device includes an organic EL element, a substrate that is provided with the organic EL element, and an encapsulating substrate that is located opposite the substrate (see, e.g., Patent Document 1). In this organic EL display device, the organic EL element can be sealed by forming a frame-shaped glass frit between the substrate and the encapsulating substrate so as to surround the organic EL element.

PRIOR ART DOCUMENTS

Patent Documents

Patent Document 1: JP 2007-200890 A

DISCLOSURE OF INVENTION

Problem to be Solved by the Invention

However, in the above conventional organic EL display device (electroluminescent device), a laser is used to form the glass frit in order to improve the barrier properties for the organic EL element. This makes the manufacturing process complicated, reduces the manufacturing yield, and thus leads to an increase in cost.

In view of these problems, it is an object of the present invention to provide an electroluminescent device that is inexpensive, is easily manufactured, and has excellent barrier properties.

Means for Solving Problem

To achieve the above object, an electroluminescent device of the present invention includes a substrate and an electroluminescent element provided on the substrate. The electroluminescent device includes a sealing layer that seals the electroluminescent element. The sealing layer includes one or more silicon oxide films. A degree of oxidation of at least one of the one or more silicon oxide films is set to 1.2 or more and 1.8 or less.

In the electroluminescent device having the above configuration, the sealing layer includes one or more silicon oxide films. Moreover, the degree of oxidation of at least one of the one or more silicon oxide films is set to 1.2 or more and 1.8 or less. Thus, unlike the conventional example, the electroluminescent device can be inexpensive, be easily manufactured, and have excellent barrier properties.

In the electroluminescent device, it is preferable that the sealing layer includes an organic film, and that a silicon oxide film with a degree of oxidation of 1.2 or more and 1.8 or less is provided to cover the electroluminescent element and the organic film is provided on the silicon oxide film in the sealing layer.

In this case, the organic film is formed on the silicon oxide film with a degree of oxidation of 1.2 or more and 1.8 or less. Such a configuration can improve the barrier properties, and can also prevent the occurrence of defects such as peeling of the sealing layer even if the electroluminescent device is bent.

In the electroluminescent device, a silicon oxide film included in the one or more silicon oxide films and an organic film may be sequentially formed on the organic film in the sealing layer.

In this case, the electroluminescent device can have more excellent barrier properties.

In the electroluminescent device, it is preferable that a silicon oxide film included in the one or more silicon oxide films is used as an outermost layer of the sealing layer.

In this case, the sealing layer can easily be configured to significantly reduce the permeation of water or the like from the outside.

In the electroluminescent device, it is preferable that the sealing layer includes a plurality of the silicon oxide films, and that the degree of oxidation of the silicon oxide film that is provided on the electroluminescent element is lower than that of the outermost silicon oxide film.

This can facilitate the formation of the electroluminescent device with excellent barrier properties.

In the electroluminescent device, it is preferable that the sealing layer includes a plurality of the silicon oxide films, and that the silicon oxide film that is provided on the electroluminescent element has a smaller thickness than the other silicon oxide films.

This can easily improve the transmittance of the sealing layer, and thus can facilitate the formation of the electroluminescent device with high brightness.

In the electroluminescent device, it is preferable that an underlying film is provided between the substrate and the electroluminescent element, that the underlying film includes one or more silicon oxide films, and that a degree of oxidation of at least one of the one or more silicon oxide films is set to 1.2 or more and 1.8 or less.

In this case, even if the substrate has flexibility, the underlying film can easily prevent the permeation of water or the like from the substrate side.

In the electroluminescent device, it is preferable that the underlying film includes an organic film, and that a silicon oxide film with a degree of oxidation of 1.2 or more and 1.8 or less is disposed in contact with the electroluminescent element and the organic film is provided on the silicon oxide film in the underlying film.

In this case, the organic film is formed on the silicon oxide film with a degree of oxidation of 1.2 or more and 1.8 or less.

Such a configuration can improve the barrier properties of the underlying film, and can also prevent the occurrence of defects such as peeling of the underlying film even if the electroluminescent device is bent.

In the electroluminescent device, it is preferable that a silicon oxide film included in the one or more silicon oxide films is used as an outermost layer of the underlying film.

In this case, the underlying film can easily be configured to significantly reduce the permeation of water or the like from the outside.

It is preferable that the electroluminescent device further includes a counter substrate that is located on an opposite side of the electroluminescent element from the substrate, and a frame-shaped sealing material that is provided between the substrate and the counter substrate to seal the electroluminescent element.

This can more reliably prevent the degradation of the electroluminescent element.

In the electroluminescent device, it is preferable that a filler layer is provided between the substrate, the counter substrate, and the sealing material.

In this case, the barrier properties for the electroluminescent element can be further improved.

Effects of the Invention

The present invention can provide an electroluminescent device that is inexpensive, is easily manufactured, and has excellent barrier properties.

BRIEF DESCRIPTION OF DRAWINGS

FIGS. 3(a) to 3(d) illustrate a series of the main manufacturing processes.

FIGS. 5(a) to 5(b) illustrate a series of the main manufacturing processes that are performed after the manufacturing process illustrated in FIG. 3(d).

FIGS. 7(a) to 7(b) illustrate a series of the main manufacturing processes that are performed after the manufacturing process illustrated in FIG. 3(d).

DESCRIPTION OF THE INVENTION

Hereinafter, preferred embodiments of an electroluminescent device of the present invention will be described with reference to the drawings. In the following description, the present invention is applied to an organic EL display device.

The size and size ratio of each of the constituent members in the drawings may not exactly represent those of the actual constituent members.

[Embodiment 1]

Figure 1:
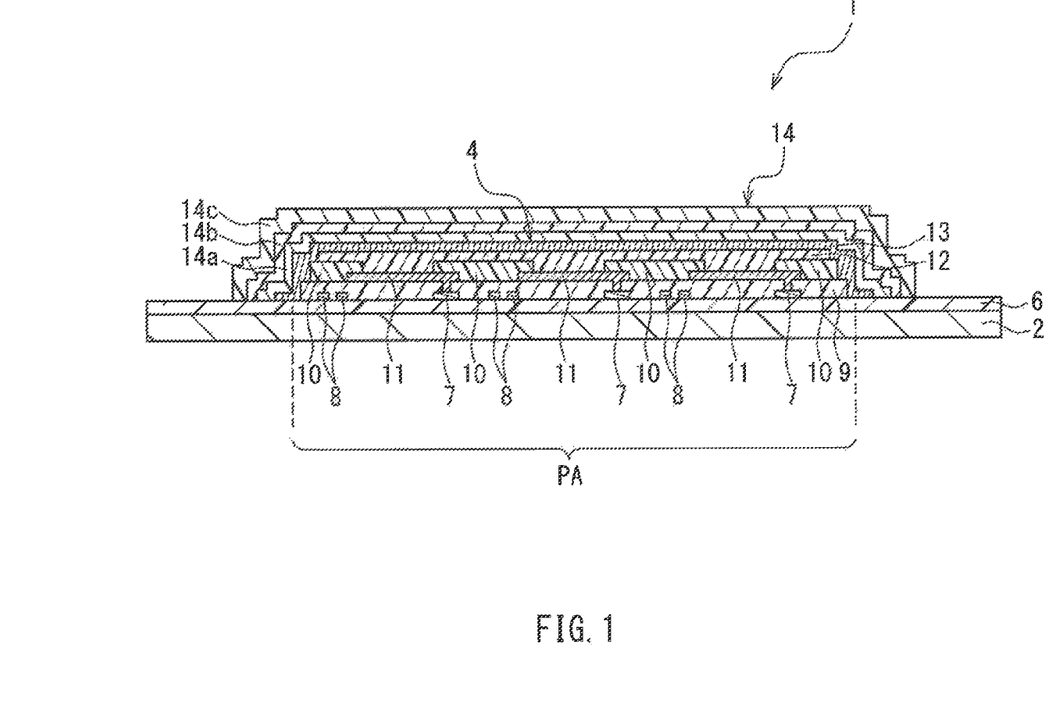
FIG. 1 is a cross-sectional view illustrating a cross section of an organic EL display device of Embodiment 1 of the present invention.

FIG. 1 is a cross-sectional view illustrating a cross section of an organic EL display device of Embodiment 1 of the present invention. In FIG. 1, an organic EL display device 1 of this embodiment includes a substrate 2 and an organic EL element (electroluminescent element) 4 provided on the substrate 2.

In the organic EL display device 1 of this embodiment, the organic EL element 4 forms a rectangular pixel area PA having a plurality of pixels (including a plurality of subpixels), and the organic EL element 4 is sealed by a sealing layer 14. The pixel area PA is a display portion of the organic EL display device 1 and displays information. In the pixel area PA, the pixels (subpixels) are arranged in a matrix, and the organic EL element 4 emits light for each subpixel so that information is displayed.

In FIG. 1, the substrate 2 is made of, e.g., a glass material or a film having flexibility (bendability). An underlying film (insulating film) 6 is formed on the substrate 2 to cover the entire surface of the substrate 2. As illustrated in FIG. 1, in light emitting regions of the organic EL display device 1, TFTs (thin-film transistors) 7 are provided on the underlying film 6 so as to correspond to each subpixel in the pixel area PA. Moreover, lines 8 are formed on the underlying film 6. The lines 8 include a plurality of source lines (signal lines) and a plurality of gate lines that are arranged in a matrix. The source lines are connected to a source driver (not shown) and the gate lines are connected to a gate driver (not shown). With this configuration, the TFTs 7 are driven on a subpixel-by-subpixel basis in accordance with an external input image signal. The TFTs 7 function as switching elements that control the light emission of the corresponding subpixels. Thus, the TFTs 7 control the light emission of any of red (R), green (G), and blue (B) subpixels of the organic EL element 4.

The underlying film 6 serves to prevent the properties of the TFTs 7 from being reduced due to the diffusion of impurities from the substrate 2 to the TFTs 7. If there is no concern for such a reduction in the properties of the TFTs 7, then the formation of the underlying film 6 may be omitted.

When the substrate 2 is made of a material having flexibility, a bendable organic EL display device 1 can easily be configured.

As illustrated in FIG. 1, an interlayer insulating film 9, an edge cover 10, and a first electrode 11 of the organic EL element 4 are formed on the substrate 2. The interlayer insulating film 9 functions as a planarization film and is formed on the underlying film 6 to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (as will be described later). Moreover, the first electrode 11 is connected to the TFTs 7 via contact holes provided in the interlayer insulating film 9.

The edge cover 10 has openings, through which the first electrode 11 is exposed, and these portions substantially form the light emitting regions of the organic EL element 4. As described above, the organic EL display device 1 of this embodiment is configured to perform full-color display by emitting light of any color of RGB. The organic EL display device 1 of this embodiment is an active matrix type display device with the TFTs (thin-film transistors) 7.

As illustrated in FIG. 1, an organic EL layer 12 and the second electrode 13 are formed on the first electrode 11. The first electrode 11, the organic EL layer 12, and the second electrode 13 constitute the organic EL element 4. In other words, the organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not shown) are formed in this order on the first electrode 11 as the organic EL layer 12, on top of which the second electrode (negative electrode) 13 is formed. Other than the above description, a single layer may have two or more functions such as a hole injection and transport layer. Moreover, a carrier blocking layer or the like may be appropriately inserted into the organic EL layer 12.

On the other hand, when the second electrode 13 is a positive electrode, the order in which the layers are stacked as the organic EL layer 12 is reversed.

When the first electrode 11 is a permeable electrode or a semi-permeable electrode and the second electrode 13 is a reflecting electrode, the organic EL display device 1 is provided as a bottom emission type device that emits light from the TFT substrate 2. In this bottom emission type organic EL display device 1, the surface of the first electrode 11 facing the TFT substrate 2 constitutes a substantial light emitting surface of the organic EL element 4, from which light is emitted to the outside.

In contrast, when the first electrode 11 is a reflecting electrode and the second electrode 13 is a permeable electrode or a semi-permeable electrode, the organic EL display device 1 is provided as a top emission type device that emits light from the sealing layer 14. In this top emission type organic EL display device 1, the surface of the first electrode 11 facing the sealing layer 14 constitutes a substantial light emitting surface of the organic EL element 4, from which light is emitted to the outside.

In the organic EL display device 1 of this embodiment, the organic EL element 4 is sealed by the sealing layer 14, as described above. The sealing layer 14 prevents moisture or oxygen from permeating (entering) the organic EL element 4 from the outside, and thus prevents degradation of the organic EL element 4.

The sealing layer 14 has a laminated structure of a silicon oxide film and an organic film, and serves not only to improve the barrier properties for the organic EL element 4, but also to enhance the display performance and bendability of the organic EL display device 1, as will be described in detail later.

Figure 2:
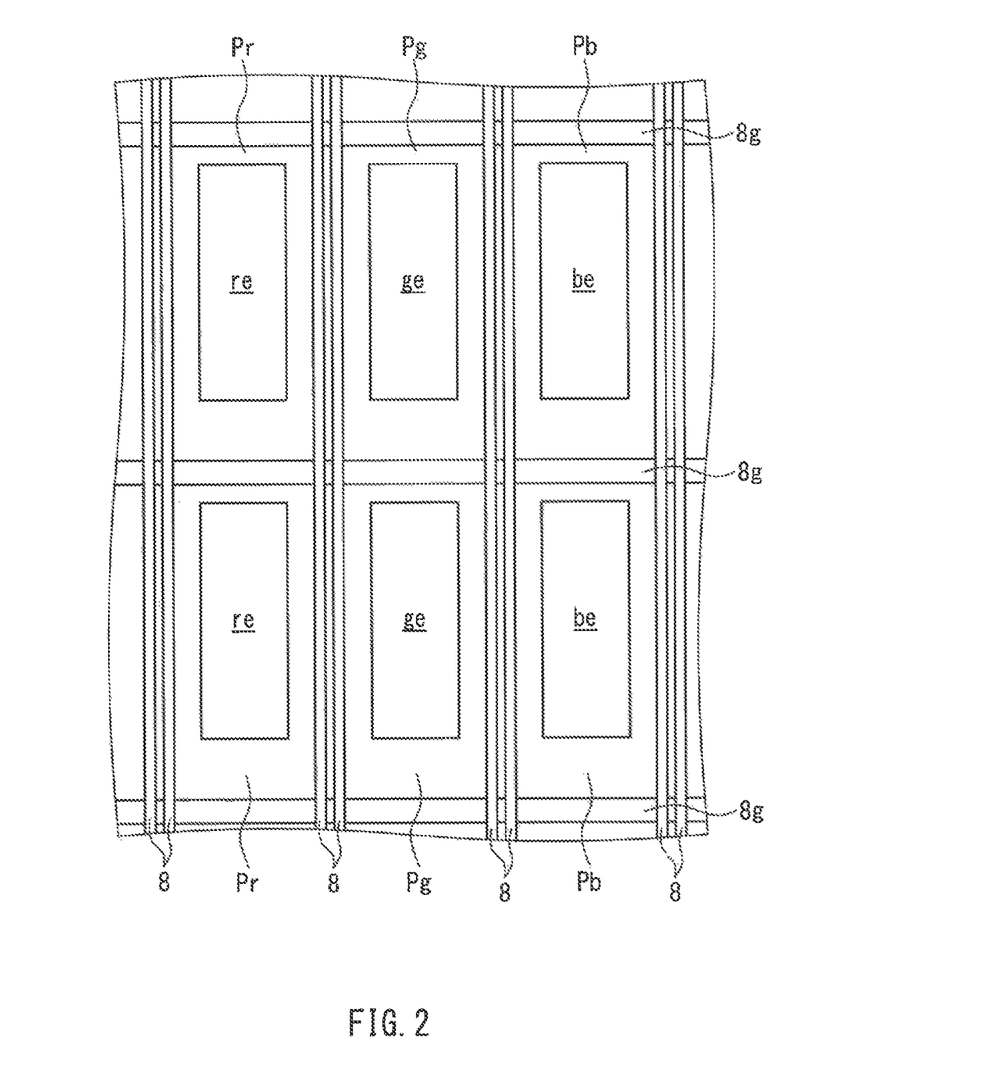
FIG. 2 is an enlarged plan view illustrating a pixel configuration of the organic EL display device.

Next, referring also to FIG. 2, the pixel area PA of the organic EL display device 1 of this embodiment will be specifically described.

FIG. 2 is an enlarged plan view illustrating a pixel configuration of the organic EL display device.

As illustrated in FIG. 2, red, green, and blue subpixels Pr, Pg, and Pb (which are collectively called subpixels P in the following) are arranged in a matrix in the pixel area PA (FIG. 1) of the organic EL display device 1 of this embodiment. The red, green, and blue subpixels Pr, Pg, and Pb emit red (R), green (G), and blue (B) colors of light, respectively. The subpixels P are separated from one another by two lines 8 and gate lines 8g connected to gates of the TFTs 7. Specifically, the size of each subpixel P in the horizontal direction of FIG. 2 is a length measured from the center line between two proximity lines 8 to the center line between two proximity lines 8 that are adjacent to those proximity lines 8 in the horizontal direction of FIG. 2. Moreover, the size of each subpixel P in the vertical direction of FIG. 2 is a length measured between the centers of two gate lines 8g that are adjacent to each other in the vertical direction of FIG. 2. The area of the pixel area of each subpixel P is defined by the horizontal size and the vertical size, as illustrated in FIG. 2.

In the pixel area PA, a set of red, green, and blue subpixels Pr, Pg, and Pb forms one pixel.

A portion of a red subpixel Pr that is exposed to an opening re of the edge cover 10 is substantially a light emitting region of the red subpixel Pr. Similarly, a portion of a green subpixel Pg that is exposed to an opening ge of the edge cover 10 is substantially a light emitting region of the green subpixel Pg. Moreover, a portion of a blue subpixel Pb that is exposed to an opening be of the edge cover 10 is substantially a light emitting region of the blue subpixel Pb.

Referring back to FIG. 1, the sealing layer 14 will be specifically described.

As illustrated in FIG. 1, the sealing layer 14 includes a silicon oxide film 14a provided to cover the organic EL element 4, an organic film 14b provided on the silicon oxide film 14a, and a silicon oxide film 14c provided on the organic film 14b.

The silicon oxide films 14a and 14c are coatings of silicon oxide (SiOx), which is an inorganic material. The degree of oxidation (i.e., the value of x of SiOx) of the silicon oxide films 14a and 14c is set to 1.2 or more and 1.8 or less. When the degree of oxidation of the silicon oxide films 14a and 14c is set to 1.2 or more and 1.8 or less, it is easy to achieve the sealing layer 14 (and therefore the organic EL display device 1) that can have excellent barrier properties and transmittance, and can also reduce the stress caused by bending.

If the degree of oxidation of the silicon oxide films 14a and 14c is less than 1.2, the sealing layer 14 may improve the barrier properties, but has low transmittance and is subjected to a large stress due to bending. Thus, there is a high probability that the sealing layer 14 will cause defects such as peeling.

On the other hand, if the degree of oxidation of the silicon oxide films 14a and 14c is more than 1.8, the sealing layer 14 may improve the transmittance and reduce the stress generated by bending, but has poor barrier properties. Thus, there is a high probability that the sealing layer 14 will be permeable to water or the like.

In the sealing layer 14, the silicon oxide films 14a and 14c have different degrees of oxidation. Specifically, the degree of oxidation of the silicon oxide film 14a provided on the organic EL element 4 may be, e.g., 1.2 and the degree of oxidation of the silicon oxide film 14c may be, e.g., 1.5. In other words, the silicon oxide film 14a, which is located closer to the organic EL element 4, has a low degree of oxidation, and the silicon oxide film 14c, which is located farther from the organic EL element 4, has a high degree of oxidation.

In the sealing layer 14, the silicon oxide films 14a and 14c have different thicknesses. Specifically, the thickness of the silicon oxide film 14a provided on the organic EL element 4 may be, e.g., 100 nm and the thickness of the silicon oxide film 14c may be, e.g., 150 nm. In other words, the silicon oxide film 14a, which is located closer to the organic EL element 4, has a small thickness, and the silicon oxide film 14c, which is located farther from the organic EL element 4, has a large thickness.

The organic film 14b is made of, e.g., organosilicon such as polysiloxane or silicon oxycarbide, acrylate, polyurea, parylene, polyimide, or polyamide. The thickness of the organic film 14b is, e.g., 100 nm or more.

The silicon oxide film 14a, the organic film 14b, and the silicon oxide film 14c are formed by, e.g., a CVD method. Other than this, the silicon oxide film 14a, the organic film 14b, and the silicon oxide film 14c may be formed by, e.g., a sputtering method or an ALD (atomic layer deposition) method.

In this case, the CVD method is preferred because it can form the silicon oxide film 14a, the organic film 14b, and the silicon oxide film 14c at a relatively low temperature, and can significantly reduce the adverse effect on the organic EL element 4.

In the organic EL display device 1 of this embodiment, the silicon oxide film 14a is provided on the organic EL element 4, and thus can more reliably prevent the adverse effect of water on the organic EL element 4. Moreover, the organic film 14b is provided on the silicon oxide film 14a. Therefore, even if the silicon oxide film 14a causes stress relaxation or defects such as cracking due to a pin hole or foreign matter, the organic film 14b can cover the silicon oxide film 14a and more reliably prevent a reduction in the barrier properties of the sealing layer 14.

Next, a method for manufacturing the organic EL display device 1 of this embodiment will be specifically described with reference to FIG. 3. The following description mainly deals with a method for manufacturing the sealing layer 14.

Figure 3:
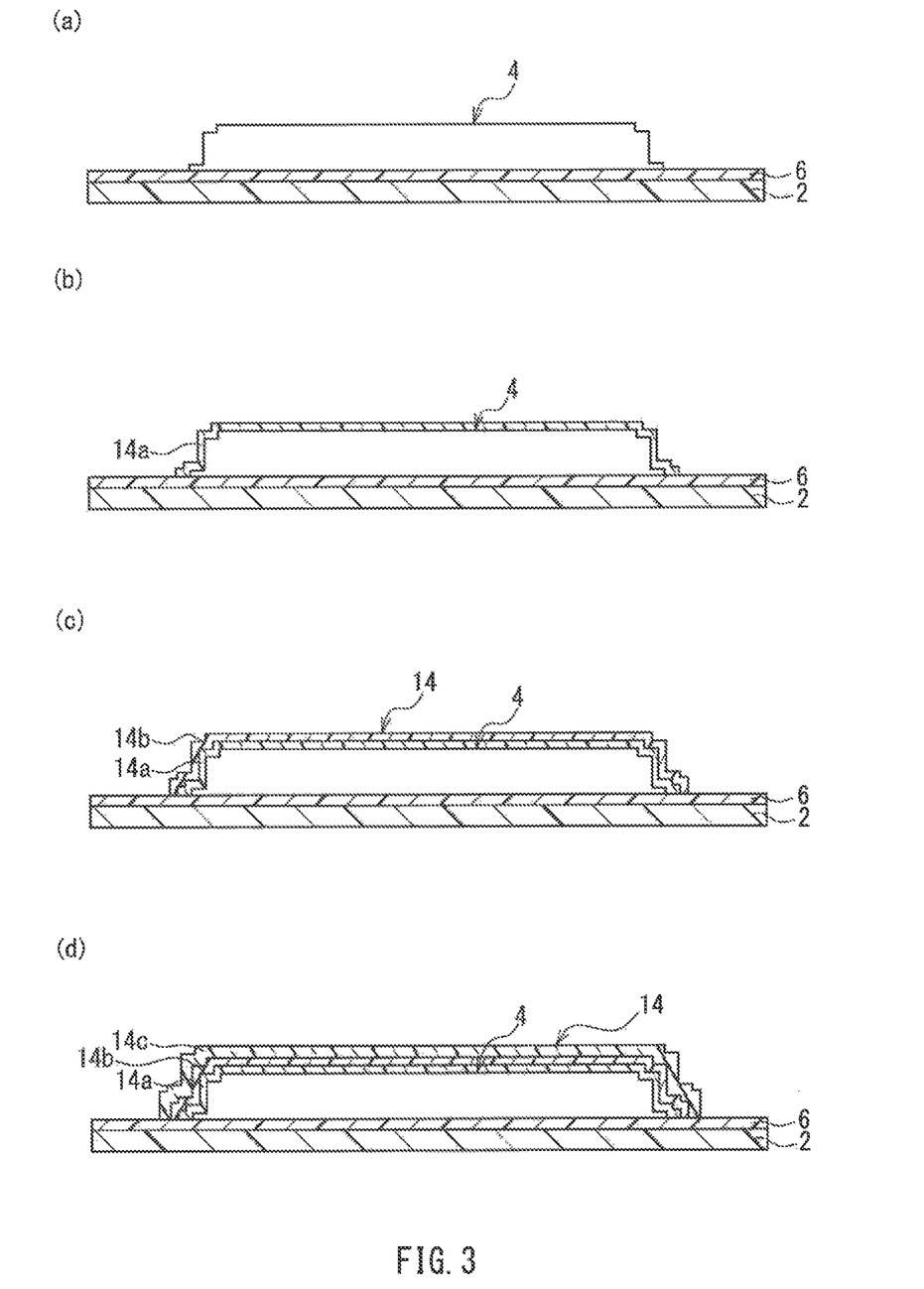
FIG. 3 is a diagram for explaining the main manufacturing processes of the organic EL display device.

FIG. 3 is a diagram for explaining the main manufacturing processes of the organic EL display device. FIGS. 3(a) to 3(d) illustrate a series of the main manufacturing processes.

In the organic EL display device 1 of this embodiment, as illustrated in FIG. 3(a), the underlying film 6 is formed on the substrate 2, and then the organic EL element 4 is formed on the underlying film 6.

Next, as illustrated in FIG. 3(b), the silicon oxide film 14a is formed to cover the organic EL element 4 by, e.g., a CVD method. More specifically, the silicon oxide film 14a is formed so that the degree of oxidation is 1.2 and the thickness is 100 nm by appropriately adjusting, e.g., the heating temperature, the pressure, the supply rate of a source gas, and the gas flow rate during the deposition process.

Subsequently, as illustrated in FIG. 3(c), the organic film 14b is formed on the silicon oxide film 14a by, e.g., a CVD method. Specifically, the organic film 14b is made of e.g., polysiloxane with a thickness of 100 nm.

Then, as illustrated in FIG. 3(d), the silicon oxide film 14c is formed on the organic film 14b by, e.g., a CVD method. More specifically, the silicon oxide film 14c is formed so that the degree of oxidation is 1.5 and the thickness is 150 nm by appropriately adjusting, e.g., the heating temperature, the pressure, the supply rate of a source gas, and the gas flow rate during the deposition process.

In the organic EL display device 1 of this embodiment having the above configuration, the sealing layer 14 includes the silicon oxide films 14a and 14c. The degree of oxidation of the silicon oxide films 14a and 14c is set to 1.2 or more and 1.8 or less. Thus, unlike the conventional example, the organic EL display device (electroluminescent device) 1 of this embodiment can be inexpensive, be easily manufactured, and have excellent barrier properties.

Hereinafter, the results of verification tests conducted by the present inventors will be described in detail.

As an example of this embodiment, a sealing layer 14 including a silicon oxide film 14a, an organic film 14b, and a silicon oxide film 14c was formed. In the sealing layer 14, the thicknesses of the silicon oxide film 14a, the organic film 14b, and the silicon oxide film 14c were 100 nm, 100 nm, and 150 nm, respectively. The organic film 14b was made of polysiloxane. The degree of oxidation of the silicon oxide film 14a was 1.2 and the degree of oxidation of the silicon oxide film 14c was 1.5. In this case, the degree of oxidation was measured by, e.g., X-ray photoelectron spectroscopy (XPS or ESCA). In the X-ray photoelectron spectroscopy, which is one of the surface analysis methods, the surface of a sample is irradiated with X-rays, and the kinetic energy of photoelectrons released from the surface of the sample is measured to analyze the elemental composition and chemical bonding state of the elements constituting the surface of the sample. More specifically, the degree of oxidation was measured by PHI 5000 manufactured by ULVAC-PHI, Inc.

As a comparative example 1, a sealing layer 14 was prepared so that the degree of oxidation of the silicon oxide films 14a and 14c in the example of this embodiment was changed to 1.0 (i.e., the silicon oxide films 14a and 14c were made of SiO).

As a comparative example 2, a sealing layer 14 was prepared so that the degree of oxidation of the silicon oxide films 14a and 14c in the example of this embodiment was changed to 2.0 (i.e., the silicon oxide films 14a and 14c were made of SiO$_2$).

The verification tests were conducted to evaluate the barrier properties, transmittance, and bending stress of the example of this embodiment, the comparative example 1, and the comparative example 2. Table 1 shows the results.

TABLE 1

| | Barrier properties (g/m$^2$/24 h) | Transmittance | Stress (distortion factor at a radius of curvature of 3 mm) |
|---|---|---|---|
| Example of this embodiment | 5 × 10$^{-3}$ or more | 90% or more | 0.008% |
| Comparative example 1 | 1 × 10$^{-2}$ or more | 75% or more | 1.8% |
| Comparative example 2 | 9 × 10$^{-3}$ or more | 40% or more | 4.0% |

As shown in Table 1, the example of this embodiment had a higher transmittance and a smaller bending stress than the comparative example 1. Thus, it was demonstrated that the organic EL display device 1 with high display performance and excellent flexibility (bendability) could be easily obtained when the example of this embodiment was used.

As shown in Table 1, the example of this embodiment was superior to the comparative example 2 in the barrier properties. Thus, it was confirmed that the organic EL display device 1 with high reliability could be easily obtained when the example of this embodiment was used, since the sealing layer was able to easily prevent the permeation of water or the like into the organic EL element 4, and also to easily prevent the degradation of the organic EL element 4.

In this embodiment, the silicon oxide film 14a provided on the organic EL element 4 has a low degree of oxidation, and the outermost silicon oxide film 14c has a high degree of oxidation. This configuration can facilitate the formation of the organic EL display device 1 with excellent barrier properties.

In this embodiment, the thickness of the silicon oxide film 14a provided on the organic EL element 4 is smaller than that of the silicon oxide film 14c. This configuration can easily improve the transmittance of the sealing layer 14, and thus can facilitate the formation of the organic EL display device 1 with high brightness.

[Embodiment 2]

Figure 4:
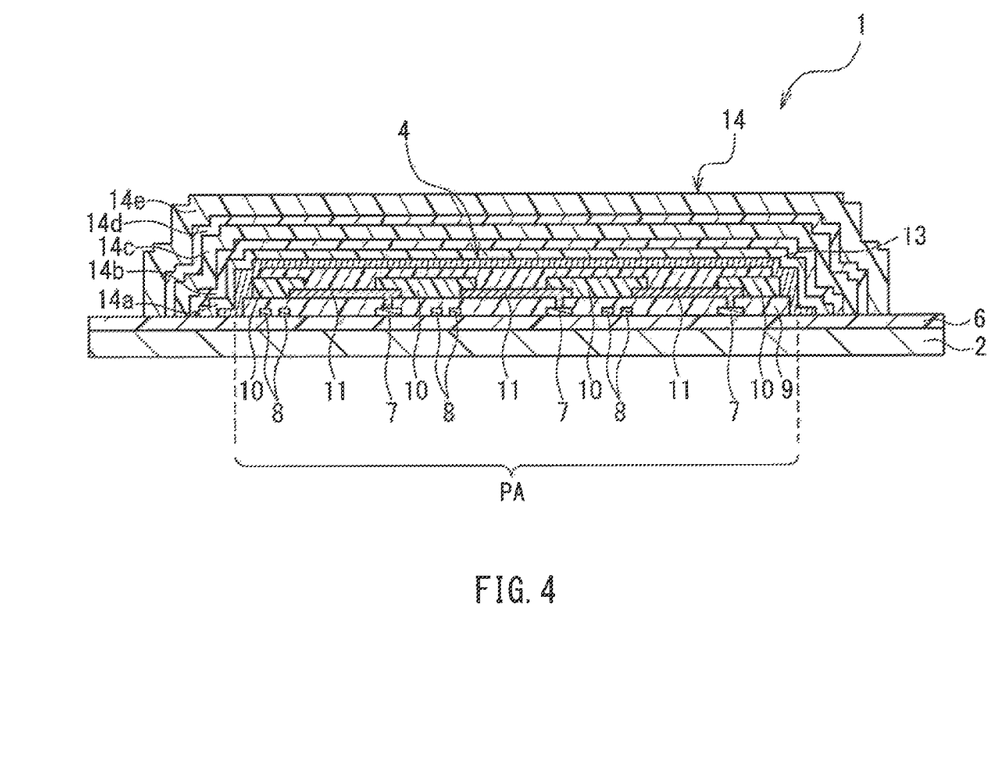
FIG. 4 is a cross-sectional view illustrating a cross section of an organic EL display device of Embodiment 2 of the present invention.

FIG. 4 is a cross-sectional view illustrating a cross section of an organic EL display device of Embodiment 2 of the present invention.

In FIG. 4, this embodiment mainly differs from Embodiment 1 in that the sealing layer includes a silicon oxide film, an organic film, a silicon oxide film, an organic film, and a silicon oxide film in this order on the organic EL element. The same components as those of Embodiment 1 are denoted by the same reference numerals, and the explanation will not be repeated.

In an organic EL display device 1 of this embodiment, as illustrated in FIG. 4, an organic film 14d is formed on the silicon oxide film 14c, and a silicon oxide film 14e is further formed on the organic film 14d.

The organic film 14d is made of e.g., polysiloxane with a thickness of 100 nm.

The degree of oxidation of the silicon oxide film 14e is higher than that of the silicon oxide film 14c and is adjusted to, e.g., 1.8. Moreover, the thickness of the silicon oxide film 14e is larger than that of the silicon oxide film 14c and is adjusted to, e.g., 200 nm.

Next, the manufacturing processes of the organic EL display device 1 of this embodiment will be specifically described with reference to FIG. 5. The following description mainly deals with the manufacturing processes of the organic film 14d and the silicon oxide film 14e.

Figure 5:
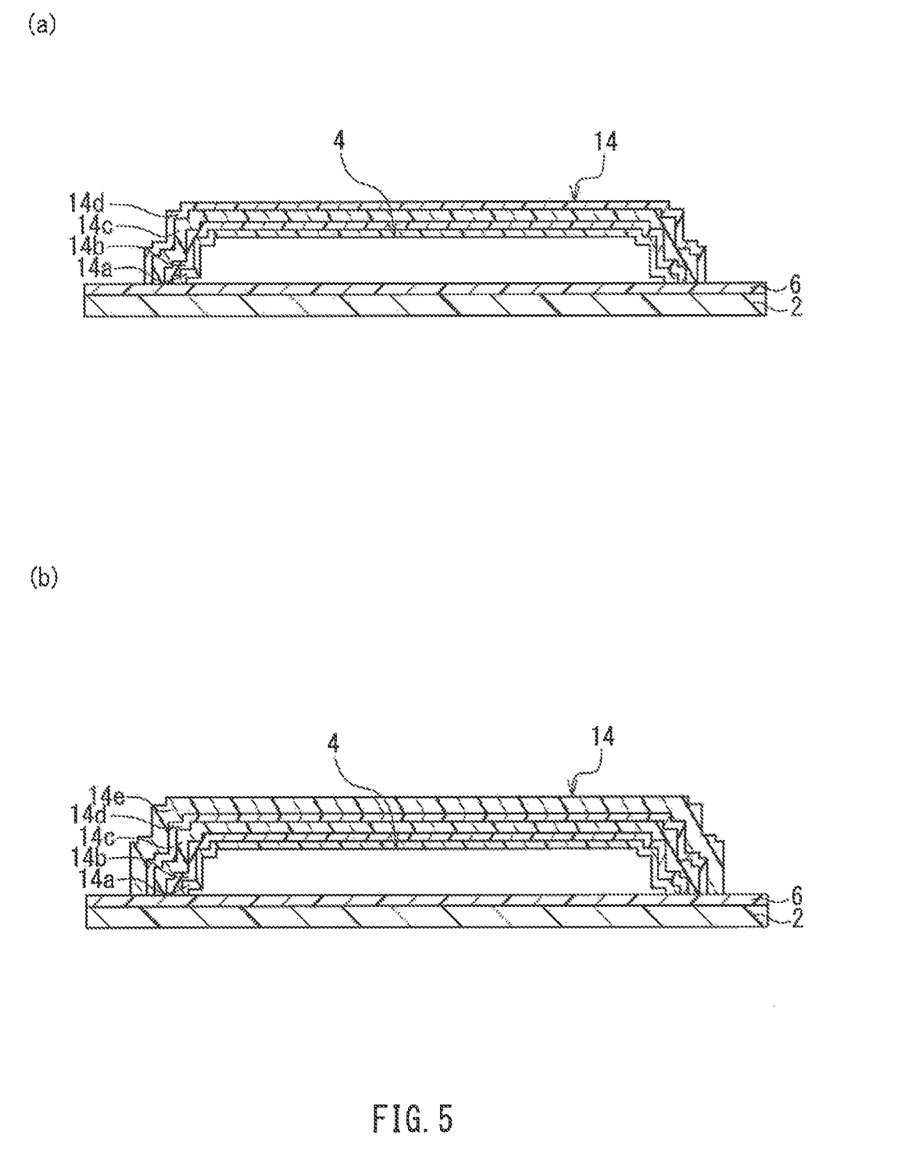
FIG. 5 is a diagram for explaining the main manufacturing processes of the organic EL display device in FIG. 4.

FIG. 5 is a diagram for explaining the main manufacturing processes of the organic EL display device in FIG. 4. FIGS. 5(a) to 5(b) illustrate a series of the main manufacturing processes that are performed after the manufacturing process illustrated in FIG. 3(d).

As illustrated in FIG. 5(a), the organic film 14d is formed on the silicon oxide film 14c by, e.g., a CVD method. Specifically, the organic film 14d is made of e.g., polysiloxane with a thickness of 100 nm.

Then, as illustrated in FIG. 5(b), the silicon oxide film 14e is formed on the organic film 14b by, e.g., a CVD method. More specifically, the silicon oxide film 14e is formed so that the degree of oxidation is 1.8 and the thickness is 200 nm by appropriately adjusting, e.g., the heating temperature, the pressure, the supply rate of a source gas, and the gas flow rate during the deposition process.

With the above configuration, this embodiment can have the same effects as those of Embodiment 1.

In this embodiment, a plurality of silicon oxide films 14a, 14c, and 14e and a plurality of organic films 14b and 14d are alternately arranged in the sealing layer 14. Thus, the organic EL display device 1 can have more excellent barrier properties.

Other than the above description, the degree of oxidation of the silicon oxide film 14e may be, e.g., 2.0.

[Embodiment 3]

Figure 6:
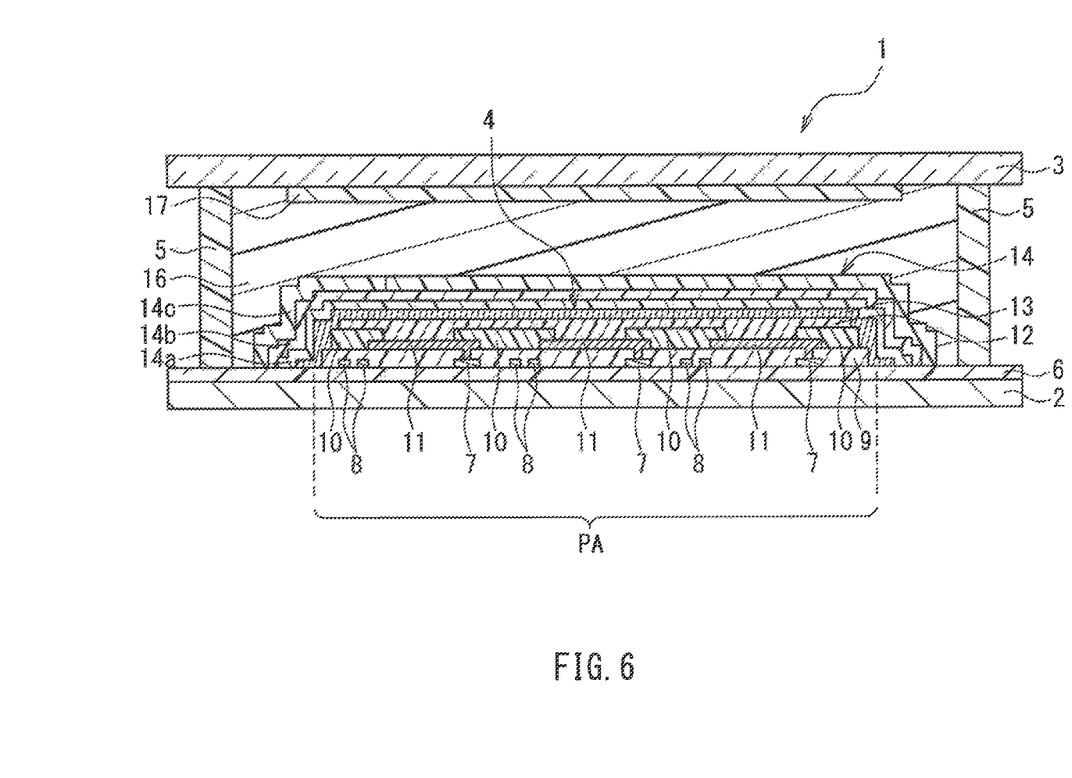
FIG. 6 is a cross-sectional view illustrating a cross section of an organic EL display device of Embodiment 3 of the present invention.

FIG. 6 is a cross-sectional view illustrating a cross section of an organic EL display device of Embodiment 3 of the present invention.

In FIG. 6, this embodiment mainly differs from Embodiment 1 in that a counter substrate is located on the opposite side of the organic EL element from the substrate, and a frame-shaped sealing material is provided between the substrate and the counter substrate to seal the organic EL element. The same components as those of Embodiment 1 are denoted by the same reference numerals, and the explanation will not be repeated.

In an organic EL display device 1 of this embodiment, as illustrated in FIG. 6, the organic EL element 4 is sealed by the substrate 2, a counter substrate 3, and a frame-shaped sealing material 5. The counter substrate 3 is located opposite the substrate 2. The sealing material 5 is provided between the substrate 2 and the counter substrate 3.

Similarly to the substrate 2, the counter substrate 3 is made of e.g., a glass material or a film having flexibility (bendability). Moreover, a color filter 17 is provided on the surface of the counter substrate 3 facing the organic EL element 4. The color filter 17 serves to improve the light emission characteristics such as the luminous quality of each of the RGB subpixels.

The sealing material 5 is formed of a resin in which a spacer and inorganic particles are dispersed. The resin may be, e.g., an epoxy resin. The spacer is used to define a cell gap between the substrate 2 and the counter substrate 3. The sealing material 5 is formed around the pixel area PA in the form of a frame. Due to the dispersion of the inorganic particles, the moisture permeability of the sealing material 5 can be reduced further.

In the organic EL display device 1 of this embodiment, a filler layer 16 is formed to cover the organic EL element 4 between the substrate 2, the counter substrate 3, and the sealing material 5. The filler layer 16 is formed by dispersing a metal oxide or activated carbon (e.g., aluminum hydroxide or calcium oxide) in a resin.

Next, the manufacturing processes of the organic EL display device 1 of this embodiment will be specifically described with reference to FIG. 7. The following description mainly deals with a process of bonding the substrate 2 and the counter substrate 3.

Figure 7:
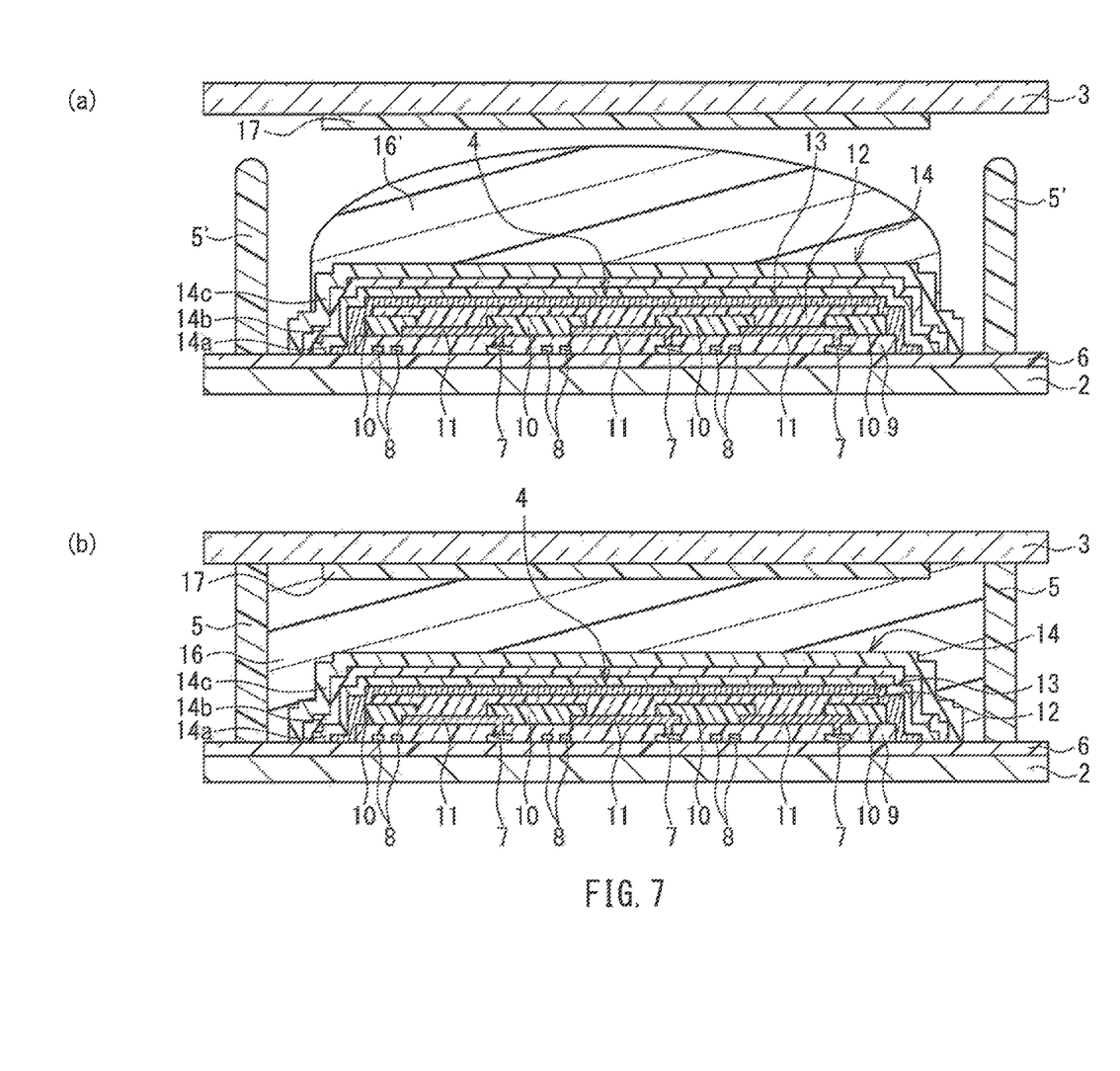
FIG. 7 is a diagram for explaining the main manufacturing processes of the organic EL display device in FIG. 6.

FIG. 7 is a diagram for explaining the main manufacturing processes of the organic EL display device in FIG. 6. FIGS. 7(a) to 7(b) illustrate a series of the main manufacturing processes that are performed after the manufacturing process illustrated in FIG. 3(d).

As illustrated in FIG. 7(a), the organic EL element 4 and the sealing layer 14 are formed on the substrate 2. Moreover, a sealing material 5' is provided on the substrate 2 so as to surround the organic EL element 4 in the form of a frame, and a filler layer 16' is placed on the sealing layer 14.

On the other hand, the color filter 17 is provided on the surface of the counter substrate 3 facing the organic EL element 4.

Then, the bonding process is performed to bond the substrate 2 and the counter substrate 3 together. In the bonding process, as illustrated in FIG. 7(b), the substrate 2 is bonded to the counter substrate 3 in a vacuum atmosphere (e.g., at 100 Pa or less). Thus, the organic EL display device 1 of this embodiment is completed.

With the above configuration, this embodiment can have the same effects as those of Embodiment 1.

This embodiment includes the counter substrate 3 that is located on the opposite side of the organic EL element 4 from the substrate 2, and the flame-shaped sealing material 5 that is provided between the substrate 2 and the counter substrate 3 to seal the organic EL element 4. Thus, this embodiment can more reliably prevent the degradation of the organic EL element 4.

In this embodiment, since the filler layer 16 is provided between the substrate 2, the counter substrate 3, and the sealing material 5, the barrier properties for the organic EL element 4 can be further improved.

[Embodiment 4]

Figure 8:
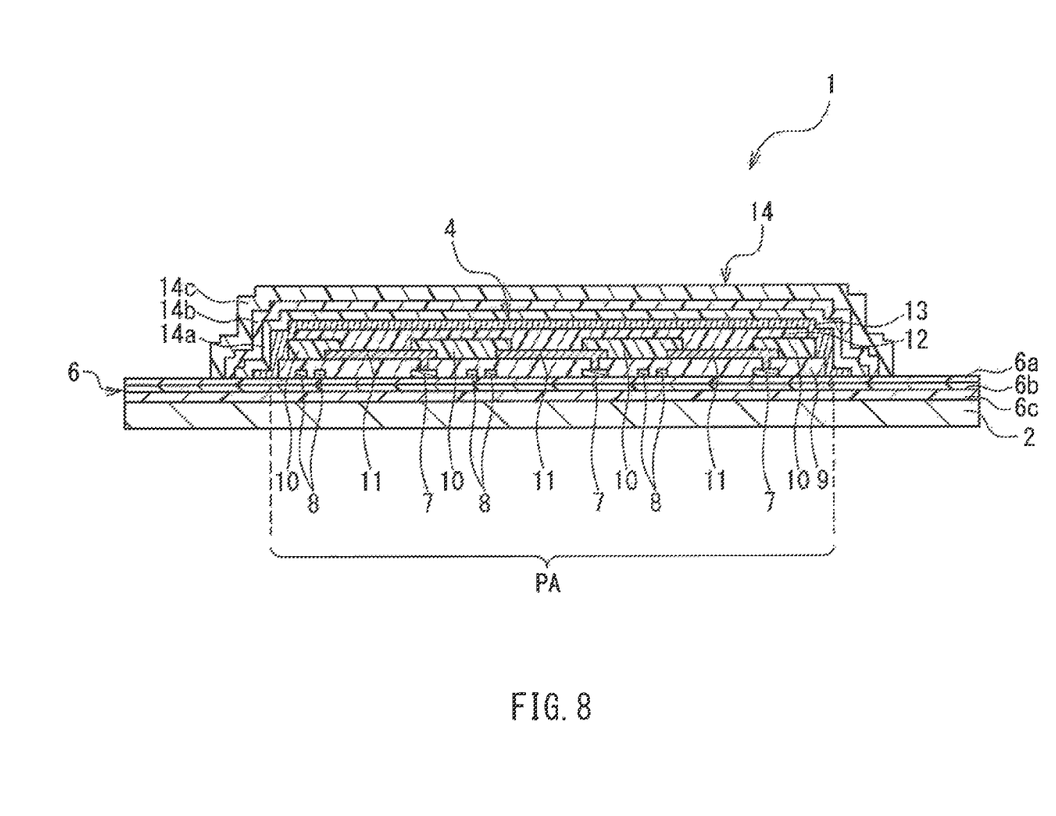
FIG. 8 is a cross-sectional view illustrating a cross section of an organic EL display device of Embodiment 4 of the present invention.

FIG. 8 is a cross-sectional view illustrating a cross section of an organic EL display device of Embodiment 4 of the present invention.

In FIG. 8, this embodiment mainly differs from Embodiment 1 in that the underlying film includes a silicon oxide film, an organic film, and a silicon oxide film. The same components as those of Embodiment 1 are denoted by the same reference numerals, and the explanation will not be repeated.

In an organic EL display device 1 of this embodiment, as illustrated in FIG. 8, the underlying film 6 includes a silicon oxide film 6a disposed in contact with the organic EL element 4, an organic film 6b provided on the silicon oxide film 6a, and a silicon oxide film 6c provided on the organic film 6b.

The degree of oxidation (i.e., the value of x of SiOx) of the silicon oxide films 6a and 6c is set to 1.2 or more and 1.8 or less.

In the underlying film 6, the silicon oxide films 6a and 6c have different degrees of oxidation. Specifically, the degree of oxidation of the silicon oxide film 6a provided on the organic EL element 4 may be, e.g., 1.2 and the degree of oxidation of the silicon oxide film 6c may be, e.g., 1.5. In other words, the silicon oxide film 6a, which is located closer to the organic EL element 4, has a low degree of oxidation, and the silicon oxide film 6c, which is located farther from the organic EL element 4, has a high degree of oxidation.

In the underlying film 6, the silicon oxide films 6a and 6c have different thicknesses. Specifically, the thickness of the silicon oxide film 6a provided on the organic EL element 4 may be, e.g., 100 nm and the thickness of the silicon oxide film 6c may be, e.g., 150 nm. In other words, the silicon oxide film 6a, which is located closer to the organic EL element 4, has a small thickness, and the silicon oxide film 6c, which is located farther from the organic EL element 4, has a large thickness.

The organic film 6b is made of e.g., organosilicon such as polysiloxane or silicon oxycarbide, acrylate, polyurea, parylene, polyimide, or polyamide. The thickness of the organic film 6b is, e.g., 100 nm or more.

The silicon oxide film 6a, the organic film 6b, and the silicon oxide film 6c are formed by, e.g., a CVD method. Other than this, the silicon oxide film 6a, the organic film 6b, and the silicon oxide film 6c may be formed by, e.g., a sputtering method or an ALD (atomic layer deposition) method.

With the above configuration, this embodiment can have the same effects as those of Embodiment 1.

In this embodiment, the underlying film 6 includes the silicon oxide film 6a, the organic film 6b, and the silicon oxide film 6c. Therefore, even if the substrate 2 has flexibility, the underlying film 6 can easily prevent the permeation of water or the like from the substrate 2 side.

In the above description, the silicon oxide film, the organic film, and the silicon oxide film constitute the underlying film. However, the underlying film of the present invention is not limited thereto, and can have any configuration as long as one or more silicon oxide films are provided, and the degree of oxidation of at least one of the one or more silicon oxide films is set to 1.2 or more and 1.8 or less.

As descried in the above embodiments, however, it is preferable that the underlying film has a configuration in which a silicon oxide film with a degree of oxidation of 1.2 or more and 1.8 or less is disposed in contact with the organic EL element (electroluminescent element) and the organic film is formed on the silicon oxide film. This is because such a configuration can improve the barrier properties, and can also prevent the occurrence of defects such as peeling of the underlying layer even if the electroluminescent device is bent.

As described in the above embodiments, it is also preferable that a silicon oxide film included in the one or more silicon oxide films is used as the outermost layer of the underlying film. This is because the underlying film can easily be configured to significantly reduce the permeation of water or the like from the outside. Moreover, in this case, the outermost layer may be, e.g., a silicon oxide film with a degree of oxidation of 2.0.

The above embodiments are all illustrative and not restrictive. The technical scope of the present invention is defined by the appended claims, and all changes that come within the range of equivalency of the claims are intended to be embraced therein.

For example, in the above description, the organic EL element is used as an electroluminescent element. However, the present invention is not limited thereto, and may use, e.g., an inorganic EL element including an inorganic compound.

In the above description, the sealing layer has a laminated structure of a silicon oxide film and an organic film. However, the sealing layer of the present invention is not limited thereto, and can have any configuration as long as one or more silicon oxide films are provided, and the degree of oxidation of at least one of the one or more silicon oxide films is set to 1.2 or more and 1.8 or less. Specifically, the sealing layer may include, e.g., at least one of the silicon oxide films.

As described in each of the above embodiments, however, it is preferable that the sealing layer has a configuration in which a silicon oxide film with a degree of oxidation of 1.2 or more and 1.8 or less is provided to cover the organic EL element (electroluminescent element) and the organic film is formed on the silicon oxide film. This is because such a configuration can improve the barrier properties, and can also prevent the occurrence of defects such as peeling of the sealing layer even if the electroluminescent device is bent.

As described in each of the above embodiments, it is also preferable that a silicon oxide film included in the one or more silicon oxide films is used as the outermost layer of the sealing layer. This is because the sealing layer can easily be configured to significantly reduce the permeation of water or the like from the outside. Moreover, in this case, the outermost layer may be, e.g., a silicon oxide film with a degree of oxidation of 2.0.

In the above description, the present invention is applied to the active matrix type organic EL display device including the TFTs (thin-film transistors) 7. However, the present invention is not limited thereto, and may be applied to a passive matrix type organic EL display device including no thin-film transistor.

In the above description, the present invention is applied to the organic EL display device. However, the present invention is not limited thereto, and may be applied to, e.g., an illuminating device such as a backlight device.

Other than the above description, Embodiments 1 to 4 may be combined as needed.

INDUSTRIAL APPLICABILITY

The present invention is useful for an electroluminescent device that is inexpensive, is easily manufactured, and has excellent barrier properties.

DESCRIPTION OF REFERENCE NUMERALS

1 Organic EL display device
2 Substrate
3 Counter substrate
4 Organic EL element (electroluminescent element)
5 Sealing material
6 Underlying film
6a Silicon oxide film
6b Organic film
6c Silicon oxide film
14 Sealing layer
14a Silicon oxide film
14b Organic film
14c Silicon oxide film
14d Organic film
14e Silicon oxide film
16 Filler layer

The invention claimed is:

1. An electroluminescent device comprising:
a flexible substrate;
an electroluminescent element provided on the flexible substrate; and
a sealing layer that seals the electroluminescent element, wherein
the sealing layer includes a first silicon oxide film, a first organic film, and a second silicon oxide film that are provided in this order from a side of the flexible substrate,
a degree of oxidation of the first silicon oxide film is 1.2 or more and 1.8 or less,
the degree of oxidation of the first silicon oxide film is less than a degree of oxidation of the second oxide film,
the sealing layer further includes a third organic film and a fifth silicon oxide film that are provided on the second silicon oxide film, and
a degree of oxidation of the fifth silicon oxide film is greater than the degree of oxidation of the second silicon oxide film.

2. The electroluminescent device according to claim 1, wherein the first silicon oxide film has a thickness that is less than a thickness of the second silicon oxide film.

3. The electroluminescent device according to claim 1, wherein
an underlying film is provided between the flexible substrate and the electroluminescent element,
the underlying film includes a third silicon oxide film, a second organic film, and a fourth silicon oxide film that are provided in this order from the side of the flexible substrate, and
a degree of oxidation of the third silicon oxide film is 1.2 or more and 1.8 or less.

4. The electroluminescent device according to claim 1, further comprising:
a counter substrate located on an opposite side of the electroluminescent element from the flexible substrate; and
a frame-shaped sealing material provided between the flexible substrate and the counter substrate to seal the electroluminescent element.

5. The electroluminescent device according to claim 4, wherein a filler layer is provided between the flexible substrate, the counter substrate, and the sealing material.

6. The electroluminescent device according to claim 1, wherein
an underlying film is provided between the flexible substrate and the electroluminescent element,
the underlying film includes a third silicon oxide film, a second organic film, and a fourth silicon oxide film that are provided in this order from the side of the flexible substrate, and
a degree of oxidation of the fourth silicon oxide film is less than a degree of oxidation of the third silicon oxide film.

7. The electroluminescent device according to claim 1, wherein
an underlying film is provided between the flexible substrate and the electroluminescent element,
the underlying film includes a third silicon oxide film, a second organic film, and a fourth silicon oxide film that are provided in this order from the side of the flexible substrate, and
the fourth silicon oxide film has a thickness that is less than a thickness of the third silicon oxide film.

8. An electroluminescent device comprising:
a flexible substrate;
an electroluminescent element provided on the flexible substrate; and
a sealing layer that seals the electroluminescent element, wherein
the sealing layer includes a first silicon oxide film, a first organic film, and a second silicon oxide film that are provided in this order from a side of the flexible substrate,
a degree of oxidation of the first silicon oxide film is 1.2 or more and 1.8 or less,
the first silicon oxide film has a thickness that is less than a thickness of the second silicon oxide film,
the sealing layer further includes a third organic film and a fifth silicon oxide film that are provided on the second silicon oxide film, and
a degree of oxidation of the fifth silicon oxide film is greater than the degree of oxidation of the second silicon oxide film.

9. The electroluminescent device according to claim 8, wherein
an underlying film is provided between the flexible substrate and the electroluminescent element,
the underlying film includes a third silicon oxide film, a second organic film, and a fourth silicon oxide film that are provided in this order from the side of the flexible substrate, and
a degree of oxidation of the third silicon oxide film is 1.2 or more and 1.8 or less.

10. The electroluminescent device according to claim 8, further comprising:
a counter substrate located on an opposite side of the electroluminescent element from the flexible substrate; and
a frame-shaped sealing material provided between the flexible substrate and the counter substrate to seal the electroluminescent element.

11. The electroluminescent device according to claim 10, wherein a filler layer is provided between the flexible substrate, the counter substrate, and the sealing material.

12. The electroluminescent device according to claim 8, wherein an underlying film is provided between the flexible substrate and the electroluminescent element, the underlying film includes a third silicon oxide film, a second organic film, and a fourth silicon oxide film that are provided in this order from the side of the flexible substrate, and a degree of oxidation of the fourth silicon oxide film is less than a degree of oxidation of the third silicon oxide film.

13. The electroluminescent device according to claim 8, wherein an underlying film is provided between the flexible substrate and the electroluminescent element, the underlying film includes a third silicon oxide film, a second organic film, and a fourth silicon oxide film that are provided in this order from the side of the flexible substrate, and the fourth silicon oxide film has a thickness that is less than a thickness of the third silicon oxide film.

* * * * *